(12) United States Patent
Ge et al.

(10) Patent No.: US 12,317,594 B2
(45) Date of Patent: May 27, 2025

(54) ARRAY SUBSTRATE, MANUFACTURING METHOD OF ARRAY SUBSTRATE, AND ELECTRONIC PAPER DISPLAY DEVICE

(71) Applicant: TCL CHINA STAR OPTOELECTRONICS TECHNOLOGY CO., LTD., Guangdong (CN)

(72) Inventors: Ru Ge, Guangdong (CN); Fen Long, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/756,654

(22) PCT Filed: May 16, 2022

(86) PCT No.: PCT/CN2022/092914
§ 371 (c)(1),
(2) Date: May 29, 2022

(87) PCT Pub. No.: WO2023/206631
PCT Pub. Date: Nov. 2, 2023

(65) Prior Publication Data
US 2024/0162251 A1    May 16, 2024

(30) Foreign Application Priority Data
Apr. 26, 2022 (CN) .......................... 202210446703.1

(51) Int. Cl.
*H10D 86/60* (2025.01)
*G02F 1/167* (2019.01)
(Continued)

(52) U.S. Cl.
CPC ............. *H10D 86/60* (2025.01); *G02F 1/167* (2013.01); *G02F 1/16755* (2019.01); *G02F 1/16766* (2019.01); *H10D 86/481* (2025.01)

(58) Field of Classification Search
CPC ... H01L 27/1255; H01L 27/124; H01L 27/12; H01L 21/84; G02F 1/167; G02F 1/16755;
(Continued)

(56) References Cited

U.S. PATENT DOCUMENTS

2010/0302621 A1* 12/2010 Wang ................... G02F 1/1679
359/296

FOREIGN PATENT DOCUMENTS

| CN | 103186005 A | 7/2013 |
|---|---|---|
| CN | 103474437 A | 12/2013 |

(Continued)

OTHER PUBLICATIONS

International Search Report in International application No. PCT/CN2022/092914, mailed on Nov. 25, 2022.
(Continued)

*Primary Examiner* — David Vu
(74) *Attorney, Agent, or Firm* — PV IP PC; Wei Te Chung

(57) ABSTRACT

The present application provides an array substrate, a manufacturing method of the array substrate, and an electronic paper display device. The array substrate includes a pixel structure. The pixel structure includes a first metal layer, a second metal layer, a third metal layer, and a thin film layer that are sequentially arranged at intervals. The first metal layer and the second metal layer form a first storage capacitor, the second metal layer and the third metal layer form a second storage capacitor, and the third metal layer and the thin film layer form a third storage capacitor. A capacitance of a storage capacitor is increased.

19 Claims, 3 Drawing Sheets

(51) Int. Cl.
   *G02F 1/16755*   (2019.01)
   *G02F 1/16766*   (2019.01)
   *H10D 86/40*     (2025.01)

(58) Field of Classification Search
   CPC ............. G02F 1/16766; G02F 1/13439; G02F 1/13606; G02F 1/136213
   See application file for complete search history.

(56)  References Cited

FOREIGN PATENT DOCUMENTS

| | | | |
|---|---|---|---|
| CN | 103943635 | A | 7/2014 |
| CN | 104600078 | A | 5/2015 |
| CN | 105977261 | A | 9/2016 |
| CN | 106068532 | A | 11/2016 |
| CN | 108761939 | A | 11/2018 |
| CN | 109116647 | A | 1/2019 |
| CN | 112968034 | A | 6/2021 |
| CN | 214751248 | U | 11/2021 |
| CN | 114296288 | A | 4/2022 |

OTHER PUBLICATIONS

Written Opinion of the International Search Authority in International application No. PCT/CN2022/092914, mailed on Nov. 25, 2022.
Chinese Office Action issued in corresponding Chinese Patent Application No. 202210446703.1 dated Sep. 24, 2024, pp. 1-6.
Chinese Office Action issued in corresponding Chinese Patent Application No. 202210446703.1 dated Dec. 3, 2024, pp. 1-7.

\* cited by examiner

ARRAY SUBSTRATE, MANUFACTURING METHOD OF ARRAY SUBSTRATE, AND ELECTRONIC PAPER DISPLAY DEVICE

FIELD OF DISCLOSURE

The present application relates to a field of display technology and in particular, relates to an array substrate, a manufacturing method of an array substrate, and an electronic paper display device.

DESCRIPTION OF RELATED ART

With continuous development of science and technology, innovation of electronic and digital products are faster, and various new products are developed. Electronic paper display devices are a new type of display device, mainly used in equipment such as electronic labels, billboards, and electronic readers. A display effect of the electronic paper display device is close to natural paper, which can reduce visual fatigue during reading. Because a pixel structure in the electronic paper display device has a long retention time, a larger storage capacitor is required to reduce an influence of pixel current leakage.

Conventional electronic paper display devices have smaller pixel structures and have limited space for enlarging the pixel electrodes and the common electrodes in the pixel structure with high pixel density. Also, by doing so, there is a risk of increasing other stray capacitances.

SUMMARY

Conventional electronic paper display devices have smaller pixel structures and have limited space for enlarging the pixel electrodes and the common electrodes in the pixel structure with high pixel density. Also, by doing so, there is a risk of increasing other stray capacitances.

The present application provides an array substrate, a manufacturing method of an array substrate, and an electronic paper display device, which increases a capacitance of a storage capacitor and reduces an influence of current leakage of a pixel structure.

In a first aspect, the present application provides an array substrate, including:

a base substrate; and a pixel structure disposed on the base substrate, wherein the pixel structure includes a first metal layer, a second metal layer, a third metal layer, and a thin film layer that are arranged in sequence and spaced apart from each other, wherein the first metal layer and the third metal layer are common electrodes, the second metal layer and the thin film layer are pixel electrodes, the first metal layer and the second metal layer constitute a first storage capacitor, the second metal layer and the third metal layer constitute a second storage capacitor, and the third metal layer and the thin film layer form a third storage capacitor.

In a second aspect, the present application further provides a manufacturing method of an array substrate, including:

providing a base substrate;

forming a first metal layer on the base substrate and forming an insulating layer on the first metal layer;

forming a second metal layer on the insulating layer and forming a first planarization layer on the second metal layer;

forming a passivation layer on the first planarization layer and forming a third metal layer on the passivation layer; and forming a second planarization layer on the third metal layer and forming a thin film layer on the second planarization layer, wherein the first metal layer and the third metal layer are common electrodes, the second metal layer and the thin film layer are pixel electrodes, the first metal layer and the second metal layer form a first storage capacitor, the second metal layer and the third metal layer form a second storage capacitor, and the third metal layer and the thin film layer form a third storage capacitor.

In a third aspect, the present application further provides an electronic paper display device, including:

the array substrate mentioned above;

a cover plate, wherein the cover plate is disposed opposite to the array substrate; and an electrophoretic layer, wherein the electrophoretic layer is arranged between the array substrate and the cover plate.

Advantages of the Present Application

The array substrate of the present application includes a base substrate and a pixel structure disposed on the base substrate. The pixel structure includes a first metal layer, a second metal layer, a third metal layer, and a thin film layer. The first metal layer and the third metal layer are common electrodes, the second metal layer and the thin film layer are pixel electrodes, the first metal layer and the second metal layer form a first storage capacitor, the second metal layer and the third metal layer form a second storage capacitor, and the third metal layer and the thin film layer form a third storage capacitor. In the array substrate of the present embodiment, by changing a manufacturing sequence of the third metal layer, a third storage capacitor is formed between the thin film layer and the third metal layer, so that the pixel structure includes three storage capacitors. A total storage capacitance is the sum of capacitances of the first storage capacitor, the second storage capacitor, and the third storage capacitor. Therefore, without changing a space of the pixel structure and without increasing stray capacitances, the present application increases the capacitance of the storage capacitor, which not only reduces an influence of pixel current leakage, but also improves display performance of an electronic paper display device using the array substrate.

BRIEF DESCRIPTION OF DRAWINGS

The technical solutions of the present application and the beneficial effects thereof will be apparent through the detailed description below with reference to specific embodiments of the present application in conjunction with accompanying drawings.

DETAILED DESCRIPTION OF EMBODIMENTS

The technical solutions of the present application will be clearly and completely described below with reference to accompanying drawings in conjunction with specific embodiments of the present application. Obviously, the described embodiments are only some of the embodiments of the present application, but not all of the embodiments. Based on the embodiments in the present application, all other embodiments obtained by those skilled in the art without creative work fall within the protection scope of the present application.

Unless otherwise defined, technical or scientific terms used in the present application shall have the ordinary meaning as understood by those of ordinary skill in the art to which this application belongs. Terms like "first" and "second" used in the present application do not indicate any order, quantity, or importance, but are merely used to distinguish the various components. Likewise, terms such as "a", "an", or "the" are not intended to limit the quantity, but rather mean at least one. Terms like "comprise" or "comprising" mean that the elements or things appearing before the terms encompass the elements or things recited after the terms and their equivalents, but do not exclude other elements or things.

Figure 1:
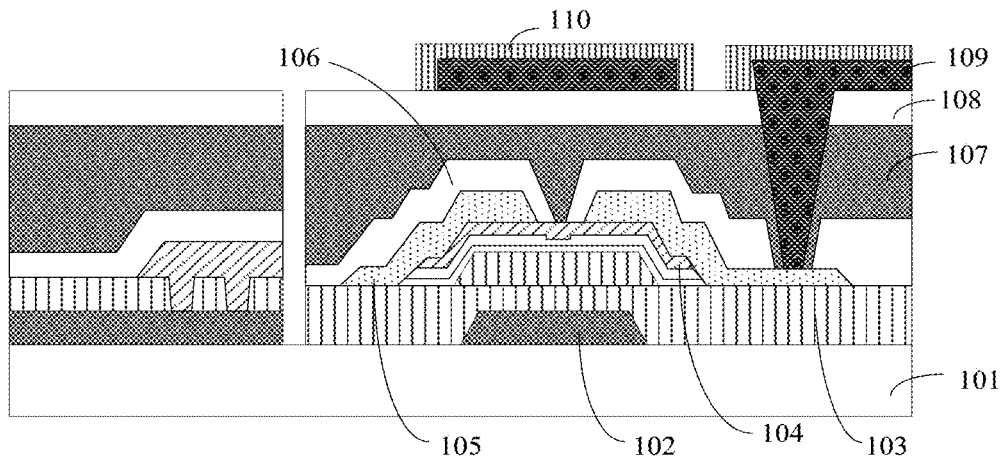
FIG. 1 is a schematic structural view illustrating a conventional array substrate according to one embodiment of the present application.

Please refer to FIG. 1. FIG. 1 is a schematic structural view illustrating an array substrate in conventional techniques. The array substrate 100 includes a base substrate 101. A pixel structure is formed on the base substrate 101. The pixel structure can be produced by using a mask process to sequentially form a first metal layer 102, an insulating layer 103, a semiconductor layer 104, a second metal layer 105, a first planarization layer 106, a passivation layer 107, a second planarization layer 108, a third metal layer 109, and a thin film layer 110 on the base substrate 101.

Two storage capacitors can be formed in the pixel structure through the first metal layer 102, the second metal layer 105, and the third metal layer 109. Specifically, the first metal layer 102 and the third metal layer 109 can be used as pixel electrodes of the pixel structure, the second metal layer 105 can be used as a common electrode of the pixel structure, the first metal layer 102 and the second metal layer 105 can form a first storage capacitor, and the second metal layer 105 and the third metal layer 109 can form a second storage capacitor.

It should be noted that a retention time of the pixel structure in an electronic paper display device is relatively long, and a larger storage capacitor is required to reduce an influence of pixel current leakage. However, an array substrate in conventional electronic paper display devices disclosed in the related art includes two storage capacitors, which makes the storage capacitors in the array substrate have small capacitances, which is not beneficial to reduce a current leakage of the pixel structure.

However, the conventional electronic paper display device has small pixel structures, and there is limited space that can be used for enlarging pixel electrodes and common electrodes in the pixel structure with high pixel density, which is also accompanied by a risk of increasing stray capacitances.

Figure 2:
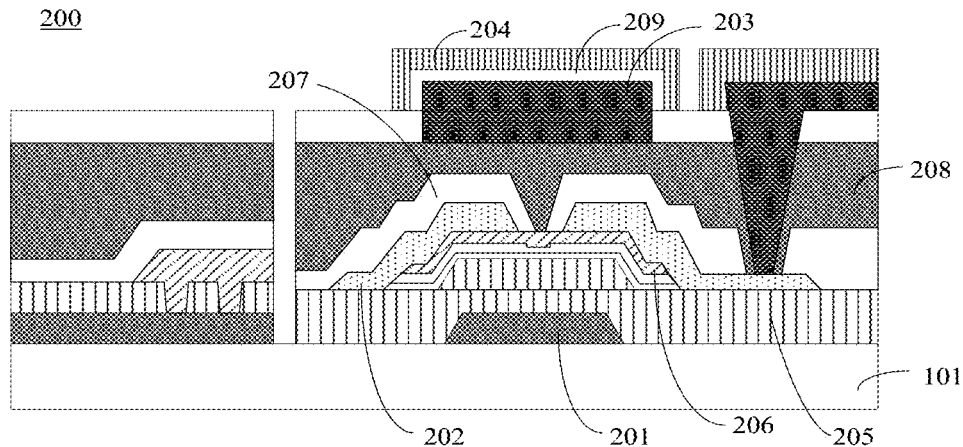
FIG. 2 is a schematic structural view illustrating an array substrate according to one embodiment of the present application.

In order to solve the problem of the small-capacitance storage capacitors in the limited space of the pixel structure of the conventional electronic paper display device, and the present application provides an array substrate, a manufacturing method of an array substrate, and an electronic paper display device. Please refer to FIG. 2. FIG. 2 is a schematic structural view of an array substrate according to one embodiment of the present application. The array substrate 100 can include a base substrate 101 and a pixel structure 200. The pixel structure 200 is disposed on the base substrate 101. The pixel structure 200 can include a first metal layer 201, a second metal layer 202, a third metal layer 203, and a thin film layer 204.

The first metal layer 201, the second metal layer 202, and the third metal layer 203 can be made of metal materials such as molybdenum, aluminum, copper, and titanium, and have a certain pattern. The pattern can be formed by one patterning process, and the one patterning process can include: photoresist coating, exposure, development, etching, and photoresist stripping, etc. Specifically, orthographic projections of the first metal layer 201, the second metal layer 202, and the third metal layer 203 projected on the base substrate 101 do not occupy an entire area of the base substrate 101, but form certain patterns on the base substrate 101.

The array substrate 100 of the present embodiment is different from the conventional array substrate 100 in that the first metal layer 201 and the third metal layer 203 serve as common electrodes of the pixel structure 200, and the second metal layer 202 and the thin film layer 204 serve as pixel electrodes of the pixel structure 200.

Specifically, a first storage capacitor can be formed between the first metal layer 201 and the second metal layer 202, a second storage capacitor can be formed between the second metal layer 202 and the third metal layer 203, and a third storage capacitor can be formed between the third metal layer 203 and the thin film layer 204.

Optionally, in the pixel structure 200, the first metal layer 201, the second metal layer 202, the third metal layer 203, and the thin film layer 204 are sequentially arranged on the base substrate 101. The first metal layer 201 and the second metal layer 202 are spaced apart, the second metal layer 202 and the third metal layer 203 are spaced apart, and the third metal layer 203 and the thin film layer 204 are spaced apart. The film layer 204 can be made of an indium tin oxide film, and the indium tin oxide film is a kind of mixture, which is mainly used for making liquid crystal displays, flat panel displays, plasma displays, touch screens, electronic papers, organic light-emitting diode, solar cells, antistatic coatings, and various optical coatings. The indium tin oxide film is electrically conductive and optical transparent. The thin film layer 204 not only can serve as the pixel electrode in the storage capacitor, but also can protect the pixel structure 200.

In the array substrate of the present embodiment, by changing a manufacturing sequence of the third metal layer 203, the third storage capacitor is formed between the thin film layer 204 and the third metal layer 203, so that the pixel structure includes three storage capacitors. A total storage capacitance is the sum of capacitances of the first storage capacitor, the second storage capacitor, and the third storage capacitor. Therefore, without changing a space of the pixel structure 200 and without increasing stray capacitances, the present application increases a capacitance of the storage capacitor in the entire pixel structure 200, which not only reduces an influence of pixel current leakage, but also improves display performance of an electronic paper display device using the array substrate 100.

Further, please continue to refer to FIG. 2. The pixel structure 200 is sequentially provided with a first metal layer 201, an insulating layer 205, a semiconductor layer 206, a second metal layer 202, a first planarization layer 207, a passivation layer 208, a third metal layer 203, a second planarization layer 209, and a thin film layer 204 on the base substrate 101. The first metal layer 201, the insulating layer 205, the semiconductor layer 206, the second metal layer 202, the passivation layer 208, the third metal layer 203, the second planarization layer 209, and the thin film layer 204 can all be prepared by using mask (reticle) processes. That is, eight mask processes are used to manufacture the pixel structure 200. The insulating layer 205 is disposed between the first metal layer 201 and the second metal layer 202, the first planarization layer 207 and the passivation layer 208 are disposed between the second metal layer 202 and the third metal layer 203, the passivation layer 208 is disposed on the first planarization layer 207, and the second planarization layer 209 is disposed between the third metal layer 203 and the thin film layer 204.

Specifically, the first metal layer 201 is deposited on the base substrate 101 and forms a pattern. The insulating layer 205 is deposited on the first metal layer 201. The semiconductor layer 206 is deposited on the insulating layer 205. The second metal layer 202 is deposited on the semiconductor layer 206. A portion of the second metal layer 202 is disposed on the insulating layer 205. The first planarization layer 207 is deposited on the second metal layer 202. The passivation layer 208 is deposited on the first planarization layer 207. The third metal layer 203 is deposited on the passivation layer 208. The second planarization layer 209 is deposited on the third metal layer 203. Finally, the thin film layer 204 is deposited on the second planarization layer 209, and the thin film layer 204 protects the entire pixel structure. The present embodiment is different from a conventional process for manufacturing the pixel structure 200 in that: in the conventional techniques, the second planarization layer 108 is first deposited on the passivation layer 107, then the third metal layer 109 is deposited on the second planarization layer 108, and finally, the thin film layer 110 is deposited on the third metal layer 109. It can be known that, in the present embodiment, a manufacturing sequence of the second planarization layer 209 and the third metal layer 203 is changed. In the conventional techniques, since the third metal layer 109 is in direct contact with the thin film layer 110, no storage capacitors can be formed between the third metal layer 109 and the thin film layer 110. In the present embodiment, the second planarization layer 209 is disposed between the third metal layer 203 and the thin film layer 204, so that the third metal layer 203 and the thin film layer 204 form a third storage capacitor, thereby increasing the overall storage capacitance of the pixel structure 200.

Figure 3:
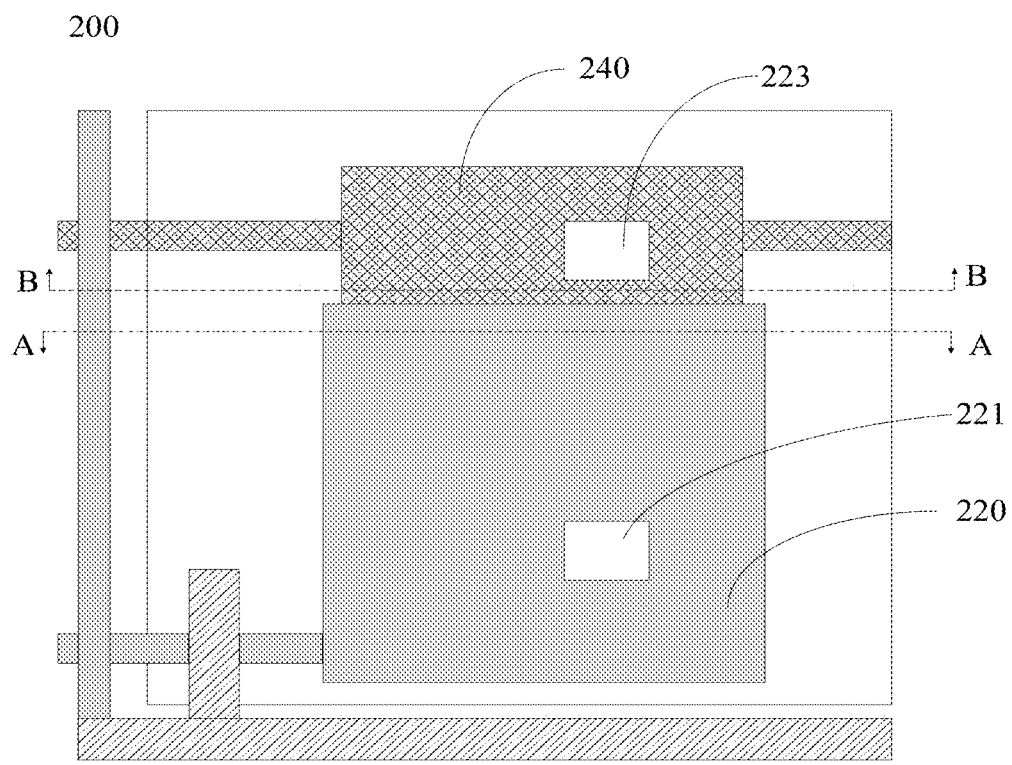
FIG. 3 is a top view of a pixel structure according to one embodiment of the present application.
Figure 4:
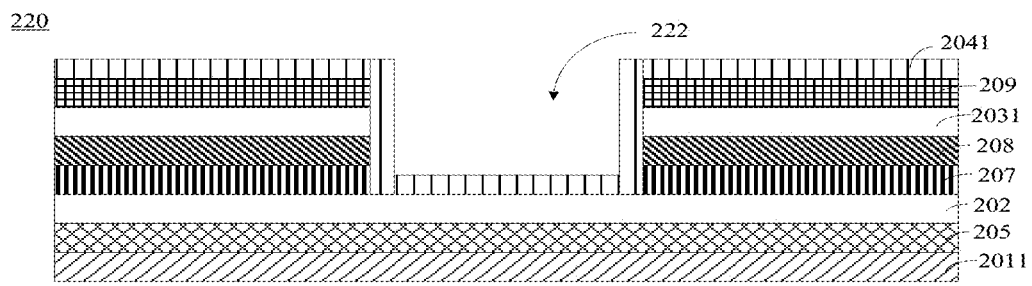
FIG. 4 is a schematic cross-sectional view taken along an A-A direction of the pixel structure shown in FIG. 3.
Figure 5:
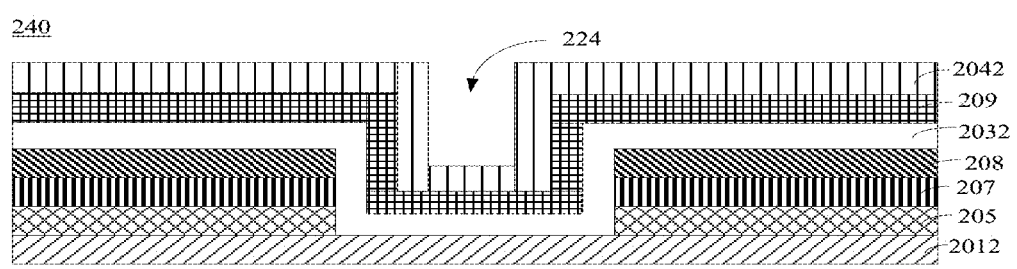
FIG. 5 is a schematic cross-sectional view taken along a B-B direction of the pixel structure shown in FIG. 3.

Please refer to FIGS. 3 to 5. FIG. 3 is a top view of the pixel structure according to one embodiment of the present application. FIG. 4 is a schematic cross-sectional view taken along an A-A direction of the pixel structure shown in FIG. 3. FIG. 5 is a schematic cross-sectional view taken along a B-B direction illustrating the pixel structure shown in FIG. 3. The pixel structure 200 can include a first pixel area 220 and a second pixel area 240, and the first pixel area 220 and the second pixel area 240 are arranged adjacent to each other.

The first pixel area 220 can include a first portion 2011 of the first metal layer, a second metal layer 202, a first portion 2031 of the third metal layer, and a first portion 2041 of the thin film layer. A first storage capacitor is formed between the first portion 2011 of the first metal layer and the second metal layer 202, a second storage capacitor is formed between the second metal layer 202 and the first portion 2031 of the third metal layer, and a third storage capacitor is formed between the first portion 2031 of the third metal layer and the first portion 2041 of the thin film layer. Optionally, in the first pixel area 220, the first portion 2011 of the first metal layer, the insulating layer 205, the second metal layer 202, the first planarization layer 207, the passivation layer 208, the first portion 2031 of the third metal layer, the second planarization layer 209, and the first portion 2041 of the thin film layer are sequentially disposed on the base substrate 101.

Please continue to refer to FIG. 3. It should be noted that, the first pixel area 220 is provided with a first via hole 221, and the first via hole 221 can sequentially extend through the second planarization layer 209, the third metal layer 203 (i.e., the first portion 2031 of the third metal layer), the passivation layer 208, and the first planarization layer 207, and extend to an upper surface of the second metal layer 202, so that a first groove 222 is formed between the first via hole 221 and the upper surface of the second metal layer 202.

Specifically, the first planarization layer 207, the passivation layer 208, the first portion 2031 of the third metal layer, and the second planarization layer 209 are patterned to form patterns through patterning processes, so as to form the first via hole 221 in the first pixel area 220. The first via hole 221 extends through the first planarization layer 207, the passivation layer 208, the first portion 2031 of the third metal layer, and the second planarization layer 209, so that the first portion 2041 of the thin film layer can partially cover a bottom and sidewalls of the first groove 222. As a result, the pixel electrode of the first portion 2041 of the thin film layer is in contact with the pixel electrode of the second metal layer 202 to realize the connection of the two pixel electrodes. In addition, another portion of the first portion 2041 of the thin film layer covers the second planarization layer 209.

The second pixel area 240 can include the second portion 2012 of the first metal layer, the second portion 2032 of the third metal layer, and the second portion 2042 of the thin film layer. The second pixel area 240 is different from the first pixel area 220 in that the second metal layer 202 is not disposed in the second pixel area 240. That is to say, the second metal layer 202 is only disposed in the first pixel area 220. An orthographic projection area of the second metal layer 202 projected on the base substrate 101 is not in the second pixel area 240. Accordingly, the second metal layer 202 can be used as a boundary between the first pixel area 220 and the second pixel area 240. The third storage capacitor is formed between the second portion 2032 of the third metal layer and the second portion 2042 of the thin film layer.

It should be noted that, since the first portion 2031 of the third metal layer and the second portion 2032 of the third metal layer are in a same layer and manufactured by a same process. The first portion 2041 of the thin film layer and the second portion 2042 of the thin film layer are in a same layer and manufactured by a same process. The third storage capacitor can be formed by the first portion 2031 of the third metal layer and the first portion 2041 of the thin film layer, and can also be formed by the second portion 2032 of the third metal layer and the second portion 2042 of the thin film layer.

Optionally, in the second pixel area 240, the second portion 2012 of the first metal layer, the insulating layer 205, the first planarization layer 207, the passivation layer 208, the second portion 2032 of the third metal layer, the second planarization layer 209, and the second portion 2042 of the thin film layer are sequentially arranged on the base substrate 101.

Please continue to refer to FIG. 3. It should be noted that, the second pixel area 240 is provided with a second via hole 223. The second via hole 223 can extend through the passivation layer 208, the first planarization layer 207, and the insulating layer 205 in sequence, and extend to an upper surface of the second portion 2012 of the first metal layer, so that a second groove 224 is formed by the second via hole 223 and the upper surface of the second portion 2012 of the first metal layer.

Specifically, the insulating layer 205, the first planarization layer 207, and the passivation layer 208 are patterned to form patterns, so as to form the second via hole 223 extending through the insulating layer 205, the first planarization layer 207, and the passivation layer 208 in the second pixel area 240. Consequently, the second portion 2032 of the third metal layer can partially cover a bottom and sidewalls of the second groove 224, so that the common electrode of the second portion 2032 of the third metal layer is in contact with the common electrode of the second portion 2012 of the first metal layer, so as to realize the connection of the two common electrodes. In addition, another portion of the second portion 2032 of the third metal layer covers the passivation layer 208, the second planarization layer 209 covers the passivation layer, and a portion of the second planarization layer 209 is located in the second groove 224. The second portion 2042 of the thin film layer covers the second planarization layer 209 and a portion of the second portion 2042 of the thin film layer is located within the second groove 224.

It should be noted that the first portion 2011 of the first metal layer, the first portion 2041 of the thin film layer, and the first portion 2031 of the third metal layer in the first pixel area 220 can be manufactured by the respective processes used to make the second portion 2012 of the first metal layer, the second portion 2042 of the thin film layer, and the second portion 2032 of the third metal layer in the second pixel area 240, so that less manufacturing processes are used, and using the same process can ensure a more even surface of a stacked structure in the first pixel area 220 and the second pixel area 240.

It can be understood that the array substrate 100 provided in the present embodiment is different from the conventional array substrate 100 in that, by changing a manufacturing sequence of the second planarization layer 209 and the third metal layer 203, the second planarization layer 209 is arranged between the third metal layer 203 and the thin film layer 204, so that the third storage capacitor is formed between the third metal layer 203 and the thin film layer 204, which increases the capacitance of the storage capacitor compared to conventional techniques. In addition, disposing the second planarization layer 209 on the third metal layer 203 can also prevent the third metal layer 203 from being corroded.

As can be seen from the above, in the array substrate 100 of the present embodiment, the manufacturing sequence of the third metal layer 203 is changed. The third storage capacitor is formed between the thin film layer 204 and the third metal layer 203, so that the pixel structure includes three storage capacitors. The total storage capacitance in the array substrate is the sum of the capacitances of the first storage capacitor, the second storage capacitor, and the third storage capacitor. Therefore, without changing the space of the pixel structure 200 and without increasing the stray capacitance, the present application increases the capacitance of the storage capacitor. In addition, the two pixel electrodes are connected, and the two common electrodes are connected to each other through the via holes defined in different pixel areas, which not only reduces the influence of pixel current leakage, but also improves the display performance of the electronic paper display device using the array substrate 100.

In addition, the present application only changes the manufacturing sequence between the second planarization layer 209 and the third metal layer 203, so the manufacturing processes and costs are not increased, and current leakage of the pixel structure is reduced in a simple manner.

Figure 6:
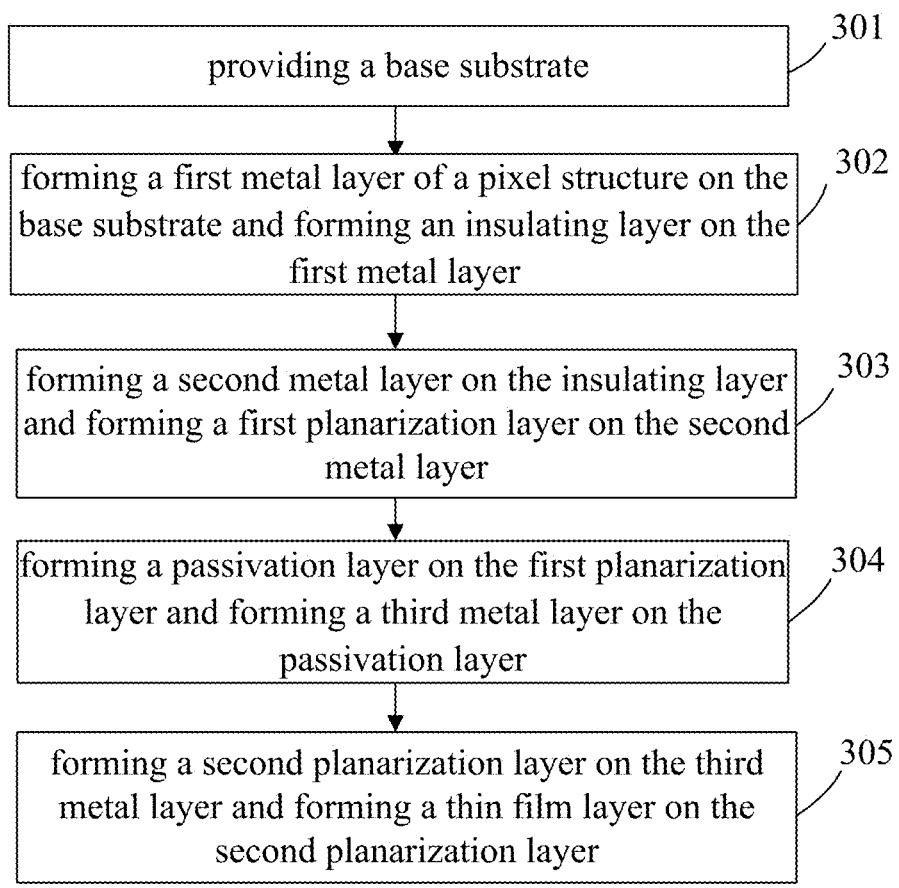
FIG. 6 is a process flow diagram illustrating a manufacturing method of the array substrate according to one embodiment of the present application.

The present application further provides a manufacturing method of an array substrate. Please refer to FIG. 6, which is process flow diagram illustrating a manufacturing method of an array substrate according to one embodiment of the present application. The array substrate can be used in an electronic paper display device. The manufacturing method of the array substrate includes steps as follows:

301: providing a base substrate.

The base substrate is provided, which can be a glass substrate or a substrate made of a transparent material.

302: forming a first metal layer on the base substrate and forming an insulating layer on the first metal layer.

The first metal layer is formed on the base substrate. The first metal layer is formed by using a patterning process. That is to say, an orthographic projection area of the first metal layer projected on the base substrate does not occupy an entire area of the base substrate, and forms a certain pattern on the base substrate. The insulating layer is deposited on the first metal layer.

303: forming a second metal layer on the insulating layer and forming a first planarization layer on the second metal layer.

304: forming a passivation layer on the first planarization layer and forming a third metal layer on the passivation layer.

305: forming a second planarization layer on the third metal layer and forming a thin film layer on the second planarization layer.

The first metal layer and the third metal layer are common electrodes. The second metal layer and the thin film layer are pixel electrodes. The first metal layer and the second metal layer are spaced apart. The second metal layer and the third metal layer are spaced apart. The third metal layer is spaced apart from the thin film layer. The first metal layer and the second metal layer form a first storage capacitor. The second metal layer and the third metal layer form a second storage capacitor. The third metal layer and the thin film layer form a third storage capacitor.

The pixel structure includes a first metal layer 201, an insulating layer 205, a semiconductor layer 206, a second metal layer 202, a first planarization layer 207, a passivation layer 208, a third metal layer 203, a second planarization layer 209, and a thin film layer 204 sequentially disposed on the base substrate 101. The first metal layer 201, the insulating layer 205, the semiconductor layer 206, the second metal layer 202, the passivation layer 208, the third metal layer 203, the second planarization layer 209, and the thin film layer 204 can all be produced using mask processes. To be specific, eight mask processes are used to produce the pixel structure 200. The insulating layer 205 is disposed between the first metal layer 201 and the second metal layer 202. The first planarization layer 207 and the passivation layer 208 are disposed between the second metal layer 202 and the third metal layer 203. The passivation layer 208 is disposed on the first planarization layer 207, and the second planarization layer 209 is disposed between the third metal layer 203 and the thin film layer 204.

Specifically, the first metal layer 201 is deposited on the base substrate 101 to form a pattern. The insulating layer 205 is deposited on the first metal layer 201. The semiconductor layer 206 is deposited on the insulating layer 205. The second metal layer 202 is deposited on the semiconductor layer 206. A portion of the second metal layer 202 is disposed on the insulating layer 205. The first planarization layer 207 is deposited on the second metal layer 202. The passivation layer 208 is deposited on the first planarization layer 207. The third metal layer 203 is deposited on the passivation layer 208. The second planarization layer 209 is deposited on the third metal layer 203. Finally, the thin film layer 204 is deposited on the second planarization layer 209, and the thin film layer 204 protects the entire pixel structure. The present embodiment is different from a conventional manufacturing process of the pixel structure in that, in conventional techniques, the second planarization layer 108 is first deposited on the passivation layer 107, then the third metal layer 109 is deposited on the second planarization layer 108, and finally, the thin film layer 110 is deposited on the third metal layer 109. It can be seen that in the present embodiment, the manufacturing sequence of the second planarization layer 209 and the third metal layer 203 is changed. Since a third metal layer 109 is in direct contact with a thin film layer 110 in the conventional techniques, no storage capacitors can be formed between the third metal layer 109 and the thin film layer 110. In the present embodiment, the second planarization layer 209 is disposed between the third metal layer 203 and the thin film layer 204, so that the third metal layer 203 and the thin film layer 204 form the third storage capacitor, thereby increasing a total capacitance of the storage capacitors of the entire pixel structure 200.

The pixel structure 200 can include a first pixel area 220 and a second pixel area 240. The first pixel area 220 and the second pixel area 240 are arranged adjacent to each other.

The first pixel area 220 can include a first portion 2011 of the first metal layer, a second metal layer 202, a first portion 2031 of the third metal layer, and a first portion 2041 of the thin film layer. A first storage capacitor is formed between the first portion 2011 of the first metal layer and the second metal layer 202, a second storage capacitor is formed between the second metal layer 202 and the first portion 2031 of the third metal layer, and a third storage capacitor is formed between the first portion 2031 of the third metal layer and the first portion 2041 of the thin film layer. Optionally, in the first pixel area 220, the first portion 2011 of the first metal layer, the insulating layer 205, the second metal layer 202, the first planarization layer 207, the passivation layer 208, the first portion 2031 of the third metal layer, the second planarization layer 209, and the first portion 2041 of the thin film layer are sequentially disposed on the base substrate.

The first pixel area 220 is provided with a first via hole 221, and the first via hole 221 can sequentially extend through the second planarization layer 209, the third metal layer 203 (i.e., the first portion 2031 of the third metal layer), the passivation layer 208, and the first planarization layer 207, and extend to an upper surface of the second metal layer 202, so that a first groove 222 is formed between the first via hole 221 and the upper surface of the second metal layer 202.

Specifically, the first planarization layer 207, the passivation layer 208, the first portion 2031 of the third metal layer, and the second planarization layer 209 are patterned to form patterns, so as to form the first via hole 221 in the first pixel area 220. The first via hole 221 extends through the first planarization layer 207, the passivation layer 208, the first portion 2031 of the third metal layer, and the second planarization layer 209, so that the first portion 2041 of the thin film layer can partially cover a bottom and sidewalls of the first groove 222, so that the pixel electrode of the first portion 2041 of the thin film layer is in contact with the pixel electrode of the second metal layer 202 to realize the connection of the two pixel electrodes. In addition, another portion of the first portion 2041 of the thin film layer covers the second planarization layer 209.

The second pixel area 240 can include the second portion 2012 of the first metal layer, the second portion 2032 of the third metal layer, and the second portion 2042 of the thin film layer. The second pixel area 240 is different from the first pixel area 220 in that the second metal layer 202 is not disposed on the second pixel area 240. That is to say, the second metal layer 202 is only disposed in the first pixel area 220. An orthographic projection area of the second metal layer 202 projected on the base substrate 101 is not in the second pixel area 240. Accordingly, the second metal layer 202 can be used as a boundary between the first pixel area 220 and the second pixel area 240. The third storage capacitor is formed between the second portion 2032 of the third metal layer and the second portion 2042 of the thin film layer.

It should be noted that, since the first portion 2031 of the third metal layer and the second portion 2032 of the third metal layer are in the same layer and manufactured by a same process. The first portion 2041 of the thin film layer and the second portion 2042 of the thin film layer are in the same layer and manufactured by a same process. The third storage capacitor can be formed by the first portion 2031 of the third metal layer and the first portion 2041 of the thin film layer, and can also be formed by the second portion 2032 of the third metal layer and the second portion 2042 of the thin film layer.

Optionally, in the second pixel area 240, the second portion 2012 of the first metal layer, the insulating layer 205, the first planarization layer 207, the passivation layer 208, the second portion 2032 of the third metal layer, the second planarization layer 209, and the second portion 2042 of the thin film layer are sequentially arranged on the base substrate 101.

As can be seen from the above, in the array substrate of the present embodiment, the manufacturing sequence of the third metal layer is changed. The third storage capacitor is formed between the thin film layer and the third metal layer, so that the pixel structure includes three storage capacitors. The total storage capacitance in the array substrate is the sum of the capacitances of the first storage capacitor, the second storage capacitor, and the third storage capacitor. Therefore, without changing the space of the pixel structure 200 and without increasing the stray capacitance, the present application increases the capacitance of the storage capacitor. In addition, the two pixel electrodes are connected, and the two common electrodes are connected to each other through the via holes defined in different pixel areas, which not only reduces the influence of pixel current leakage, but also improves the display performance of the electronic paper display device using the array substrate.

It should be noted that, the second pixel area 240 is provided with a second via hole 223. The second via hole 223 can extend through the passivation layer 208, the first planarization layer 207, and the insulating layer 205 in sequence, and extend to an upper surface of the second portion 2012 of the first metal layer, so that a second groove 224 is formed by the second via hole 223 and the upper surface of the second portion 2012 of the first metal layer.

Specifically, the insulating layer 205, the first planarization layer 207, and the passivation layer 208 are patterned by a patterning process, so as to form the second via hole 223 extending through the insulating layer 205, the first planarization layer 207, and the passivation layer 208 in the second pixel area 240. Consequently, the second portion 2032 of the third metal layer can partially cover a bottom and sidewalls of the second groove 224, so that the common electrode of the second portion 2032 of the third metal layer is in contact with the common electrode of the second portion 2012 of the first metal layer, so as to realize the connection of the two common electrodes. In addition, another part of the second portion 2032 of the third metal layer covers the passivation layer 208, the second planarization layer 209 covers the passivation layer, and a portion of the second planarization layer 209 is located in the second groove 224. The second portion 2042 of the thin film layer covers the second planarization layer 209 and a portion of the second portion 2042 of the thin film layer is located within the second groove 224.

It should be noted that the first portion 2011 of the first metal layer, the first portion 2041 of the thin film layer, and the first portion 2031 of the third metal layer in the first pixel area 220 can be manufactured by the respective processes used to make the second portion 2012 of the first metal layer, the second portion 2042 of the thin film layer, and the second portion 2032 of the third metal layer in the second pixel area 240, so that less manufacturing processes are used, and using the same process can ensure a more even surface of a stacked structure in the first pixel area 220 and the second pixel area 240.

It can be understood that the array substrate 100 provided in the present embodiment is different from the conventional array substrate 100 in that, by changing the manufacturing sequence of the second planarization layer 209 and the third metal layer 203, the second planarization layer 209 is arranged between the third metal layer 203 and the thin film layer 204, so that the third storage capacitor is formed between the third metal layer 203 and the thin film layer 204, which increases the capacitance of the storage capacitor compared to conventional techniques. In addition, disposing the second planarization layer 209 on the third metal layer 203 can also prevent the third metal layer 203 from being corroded.

In addition, the present application only changes the manufacturing sequence between the second planarization layer and the third metal layer, so the manufacturing processes and costs are not increased, and current leakage of the pixel structure is reduced in a simple manner.

The present application also provides an electronic paper display device. The electronic paper display device can be a wearable device such as a watch, a wristband, or the like. Alternatively, the display device can be an electronic device such as a mobile phone or a tablet computer, or the display device can be products or components with display functions, such as televisions, monitors, notebook computers, digital photo frames, or navigators.

The electronic paper display device can include an array substrate 100, a cover plate and an electrophoretic layer. The cover plate is disposed opposite to the array substrate 100. The electrophoretic layer is disposed between the array substrate and the cover plate. The array substrate 100 includes a plurality of pixel structures arranged in an array. Each pixel structure includes a pixel electrode and a common electrode. The pixel electrode and the common electrode can form at least three storage capacitors. Through the storage capacitors, a voltage applied to the pixel electrode can be maintained with stability.

In the above-mentioned embodiments, the description of each embodiment has its own emphasis. For those that are not described in detail in a certain embodiment, reference can be made to the relevant descriptions of other embodiments.

The array substrate, the manufacturing method of the array substrate, and the electronic paper display device of the present application have been described in detail above. The working principles and embodiments of the present application are described with specific examples in the present disclosure. The descriptions of the above embodiments are only used for ease of understanding the method and the main ideas of the present application. According to the idea of the present application, those skilled in the art can make changes in the specific embodiments and application range. In summary, the present specification should not be understood as a limitation to the present application.

What is claimed is:

1. An array substrate, comprising:
 a base substrate; and
 a pixel structure disposed on the base substrate, wherein the pixel structure comprises a first metal layer, a second metal layer, a third metal layer, and a thin film layer that are arranged in sequence and spaced apart from each other, wherein the first metal layer and the third metal layer are common electrodes, the second metal layer and the thin film layer are pixel electrodes, the first metal layer and the second metal layer constitute a first storage capacitor, the second metal layer and the third metal layer constitute a second storage capacitor, and the third metal layer and the thin film layer form a third storage capacitor.

2. The array substrate according to claim 1, wherein an insulating layer is disposed between the first metal layer and the second metal layer in the pixel structure, a first planarization layer and a passivation layer are disposed between the second metal layer and the third metal layer, the first planarization layer is disposed on the second metal layer, the passivation layer is disposed on the first planarization layer, and a second planarization layer is arranged between the third metal layer and the thin film layer.

3. The array substrate according to claim 2, wherein the pixel structure comprises a first pixel area and a second pixel area arranged adjacent to each other, the first pixel area comprises a first portion of the first metal layer, the second metal layer, a first portion of the third metal layer, and a first portion of the thin film layer, and the second pixel area comprises a second portion of the first metal layer, a second portion of the third metal layer, and a second portion of the thin film layer.

4. The array substrate according to claim 3, wherein the first storage capacitor is constituted by the first portion of the first metal layer and the second metal layer, the second storage capacitor is constituted by the second metal layer and the first portion of the third metal layer, and the third storage capacitor is constituted by the first portion of the third metal layer and the first portion of the thin film layer and by the second portion of the third metal layer and the second portion of the thin film layer.

5. The array substrate according to claim 3, wherein a first via hole is defined in the first pixel area, and the first via hole sequentially extends through the second planarization layer, the third metal layer, the passivation layer, and the first planarization layer and extends to an upper surface of the second metal layer.

6. The array substrate according to claim 5, wherein the first via hole and the second metal layer form a first groove, and a portion of the thin film layer covers a bottom and sidewalls of the first groove, so that the pixel electrode of the thin film layer is in contact with the pixel electrode of the second metal layer.

7. The array substrate according to claim 3, wherein a second via hole is defined in the second pixel area, and the second via hole sequentially extends through the passivation layer, the first planarization layer, and the insulating layer and extends to an upper surface of the first metal layer.

8. The array substrate according to claim 7, wherein the second via hole and the first metal layer form a second groove, and a portion of the third metal layer covers a bottom and sidewalls of the second groove, so that the common electrode of the third metal layer is in contact with the common electrode of the first metal layer.

9. The array substrate according to claim 3, wherein the first portion of the first metal layer in the first pixel area and the second portion of the first metal layer in the second pixel area are formed by a same process.

10. The array substrate according to claim 3, wherein the first portion of the third metal layer in the first pixel area and the second portion of the third metal layer in the second pixel area are formed by a same process.

11. The array substrate according to claim 3, wherein the first portion of the thin film layer in the first pixel area and the second portion of the thin film layer in the second pixel area are formed by a same process.

12. A manufacturing method of an array substrate, comprising following steps:
providing a base substrate;
forming a first metal layer on the base substrate and forming an insulating layer on the first metal layer;
forming a second metal layer on the insulating layer and forming a first planarization layer on the second metal layer;
forming a passivation layer on the first planarization layer and forming a third metal layer on the passivation layer; and
forming a second planarization layer on the third metal layer and forming a thin film layer on the second planarization layer,
wherein the first metal layer and the third metal layer are common electrodes, the second metal layer and the thin film layer are pixel electrodes, the first metal layer and the second metal layer form a first storage capacitor, the second metal layer and the third metal layer form a second storage capacitor, and the third metal layer and the thin film layer form a third storage capacitor.

13. The manufacturing method of the array substrate according to claim 12, wherein the array substrate comprises a first pixel area and a second pixel area arranged adjacent to each other, and the step of forming the second planarization layer on the third metal layer and forming the thin film layer on the second planarization layer comprises:
forming a first via hole in the first pixel area, wherein the first via hole extends through the second planarization layer, the third metal layer, the passivation layer, and the first planarization layer and extends to an upper surface of the second metal layer, and wherein the first via hole and the second metal layer form a first groove; and
forming the thin film layer on a bottom and sidewalls of the first groove and on the second planarization layer, so that the pixel electrode of the thin film layer is in contact with the pixel electrode of the second metal layer.

14. The manufacturing method of the array substrate according to claim 12, wherein the array substrate comprises a first pixel area and a second pixel area arranged adjacent to each other, and the step of forming the passivation layer on the first planarization layer and forming the third metal layer on the passivation layer comprises:
forming a second via hole in the second pixel area, wherein the second via hole extends through the passivation layer, the first planarization layer, and the insulating layer and extends to an upper surface of the first metal layer, and wherein the second via hole and the first metal layer form a second groove; and
forming the third metal layer on a bottom and sidewalls of the second groove and on the passivation layer, so that the common electrode of the third metal layer is in contact with the common electrode of the first metal layer.

15. An electronic paper display device, comprising:
an array substrate comprising a base substrate and a pixel structure;
a cover plate, wherein the cover plate is disposed opposite to the array substrate; and
an electrophoretic layer, wherein the electrophoretic layer is arranged between the array substrate and the cover plate,
wherein the pixel structure is disposed on the base substrate, and the pixel structure comprises a first metal layer, a second metal layer, a third metal layer, and a thin film layer, wherein the first metal layer and the third metal layer are common electrodes, the second metal layer and the thin film layer are pixel electrodes, the first metal layer and the second metal layer constitute a first storage capacitor, the second metal layer and the third metal layer constitute a second storage capacitor, and the third metal layer and the thin film layer form a third storage capacitor.

16. The electronic paper display device according to claim 15, wherein an insulating layer is disposed between the first metal layer and the second metal layer in the pixel structure; a first planarization layer and a passivation layer are arranged between the second metal layer and the third metal layer, the first planarization layer is disposed on the second metal layer; the passivation layer is disposed on the first planarization layer, and a second planarization layer is disposed between the third metal layer and the thin film layer.

17. The electronic paper display device according to claim 16, wherein the pixel structure comprises a first pixel area and a second pixel area arranged adjacent to each other; the first pixel area comprises a first portion of the first metal layer, the second metal layer, a first portion of the third metal layer, and a first portion of the thin film layer; the second pixel area comprises a second portion of the first metal layer, a second portion of the third metal layer, and a second portion of the thin film layer; the first portion of the first metal layer and the second metal layer constitute the first storage capacitor, the second metal layer and the first portion of the third metal layer constitute the second storage capacitor, and the first portion of the third metal layer, the first portion of the thin film layer, the second portion of the third metal layer, and the second portion of the thin film layer constitute the third storage capacitor.

18. The electronic paper display device according to claim 17, wherein a first via hole is defined in the first pixel area, the first via hole sequentially extends through the second planarization layer, the third metal layer, the passivation layer, and the first planarization layer and extends to an upper surface of the second metal layer, the first via hole and the second metal layer form a first groove, and a portion of the thin film layer covers a bottom and sidewalls of the first groove, such that the pixel electrode of the thin film layer contacts the pixel electrode of the second metal layer.

19. The electronic paper display device according to claim 17, wherein a second via hole is defined in the second pixel area, the second via hole sequentially extends through the passivation layer, the first planarization layer, and the insulating layer and extends to an upper surface of the first metal layer, the second via hole and the first metal layer form a second groove, and a portion of the third metal layer covers a bottom and sidewalls of the second groove, such that the common electrode of the third metal layer is in contact with the common electrode of the first metal layer.

* * * * *